United States Patent [19]
Hughes et al.

[11] Patent Number: 5,666,303
[45] Date of Patent: Sep. 9, 1997

[54] CURRENT MEMORY

[75] Inventors: John B. Hughes, Hove; Kenneth W. Moulding, Horley, both of England

[73] Assignee: U.S. Philips Corporation, New York, N.Y.

[21] Appl. No.: 708,162

[22] Filed: Aug. 27, 1996

[30]    Foreign Application Priority Data

Aug. 31, 1995 [GB] United Kingdom ............... 9517787

[51] Int. Cl.$^6$ ................................................. G11C 27/00
[52] U.S. Cl. ......................................... 365/45; 365/233
[58] Field of Search ................................. 365/45, 233

[56]          References Cited

U.S. PATENT DOCUMENTS 5,289,401  2/1994  Shima ............................... 365/45
5,400,273  3/1995  Hughes et al. ..................... 365/45
5,430,670  7/1995  Rosenthal ......................... 365/45

*Primary Examiner*—Son T. Dinh
*Attorney, Agent, or Firm*—Bernard Franzblau; Michael E. Marion

[57]            ABSTRACT

A current memory for balanced current inputs comprises two coarse and two fine current memory cells each of which comprises a field effect transistor having a switch between its gate and source electrodes. Parasitic gate-drain capacitances are neutralised by capacitors connected between the gate and drain electrodes of opposite pairs of transistors. Other current transport errors can be compensated by providing appropriately dimensioned extra capacitance added to each of the neutralising capacitors.

10 Claims, 4 Drawing Sheets

CURRENT MEMORY

BACKGROUND OF THE INVENTION

This invention relates to an analogue current memory for storing input signals in the form of balanced sampled currents.

An analogue current memory comprising a first, coarse, current memory cell, a second, fine, current memory cell, an input for receiving a current to be stored, an output for delivering the stored current, first switch means for applying the input current to the first current memory cell during a first part of a first portion of a clock cycle, second switch means for applying the input current to the second current memory cell during a second part of the first portion of the clock cycle, and third switch means for delivering the combined output currents of the first and second current memory cells to the output of the current memory during a later portion of the clock cycle or during a subsequent clock cycle is disclosed in EP-A-0608 936, corresponding to U.S. Pat. No. 5,400,273 (PHB 33830). Two such current memories can be combined to produce a current memory suitable for storing balanced currents. While this current memory, which is known as $S^2I$ current memory, gives a better performance than the simple current memory earlier proposed for switched current circuits and shown in FIG. 3.4 at page 36 of the book edited by C. Toumazou, J. B. Hughes, and N. C. Battersby entitled "SWITCHED-CURRENTS an analogue technique for digital technology" and published by Peter Peregrinus Limited in 1993, it still does not give an ideal performance.

In the operation of a switched-current memory, current transport errors are produced for a variety of reasons and these have been already described in the book edited by C. Toumazou et. al. referred to above. Briefly, they result from drain conductance of the memory transistors, drain-gate capacitance of the memory transistors and charge injection from the memory switches. These effects give the memory a current transport gain below its ideal value of unity. When used in integrators these non-ideal memories give a reduced Q-factor through the damping they introduce.

A variety of techniques have been employed to minimize these effects as described in the book referred to above and recently the $S^2I$ technique was introduced. While the $S^2I$ technique has proved highly effective in reducing errors, it has least impact on reducing errors arising from drain-gate capacitance. So, while reduction of drain-gate capacitance errors is important to all switched currents (SI) circuits, it is particularly so for the $S^2I$ approach.

SUMMARY OF THE INVENTION

It is an object of the invention to provide an analogue current memory for balanced input currents by combining two current memories as disclosed in EP-A-0608 936 and which reduces the errors arising from drain-gate capacitance.

The invention provides an analogue current memory for storing input signals in the form of sampled currents comprising first and second inputs for receiving balanced current samples, first and second outputs for supplying stored balanced current samples, a first current memory cell having an input coupled to the first input of the current memory and an output coupled to the first output of the current memory, and a second current memory cell having an input coupled to the second input of the current memory and an output coupled to the second output of the current memory; wherein the first and second current memory cells each comprise a coarse memory cell and a fine memory cell, the coarse memory cell sampling the input current during a first part of a first portion of a clock cycle and the fine current memory cell sampling the input current and the current stored by the coarse memory cell during a second part of the first portion of the clock cycle, said first and second current memory cells producing a stored output current during a second portion of said clock cycle or during a subsequent clock cycle, said stored output current being the combined outputs of the coarse and fine memory cells, in which the coarse and fine memory cells each comprise a field effect transistor having a switch connected between its gate and drain electrodes, a stored output current being available when said switch is open, characterised in that the gate electrode of the field effect transistor in each coarse memory cell is connected to the drain electrode of the transistor in the other coarse memory cell via a capacitor having a capacitance equal to the drain gate capacitance of the transistors in the coarse memories and in that the gate electrode of the transistors in each fine current memory cell is connected to the drain electrode of the transistor in the other fine current memory cell via a capacitor having a capacitance equal to the drain-gate capacitance of the transistors in the fine current memory cells.

By providing neutralising capacitors to compensate for the drain-gate capacitance of the memory transistors the charge on the gate-source capacitances of the memory transistors is maintained more nearly constant for a balanced voltage disturbance at the output terminals.

The capacitance of the capacitors may be increased to compensate for other imperfections in the transistors and may be selected to compensate additionally for current transport errors due to drain conductance.

This enables neutralising of other current transport errors due to drain conductance and charge injection etc. As is shown hereinafter the value for the added capacitance can be calculated from a knowledge of the device characteristics. The transistors of two coarse, or two fine, current memory cells may be arranged opposite each other on a substrate and each formed as two subtransistors, wherein the gate polysilicon of one transistor is extended to be interleaved with the two drain electrodes of the other transistors. The two drain electrodes may have a common area which extends over at least part of the extension of the gate polysilicon.

Alternatively or in addition the transistors of two coarse, or two fine, current memory cells may be arranged opposite each other on a substrate, the direction of the drain, gate, and source of one being opposite to that of the other, wherein the active area is extended past the drain electrode and its outer edge is defined by an extension of the gate polysilicon of the other transistor. In this way the capacitors are formed in the same technology as the memory transistors and will thus track the values of the drain-gate capacitance of the memory transistors with processing spreads. In addition the arrangement of the active areas and electrodes may be such that mask misalignments still leave the relative values of the capacitances correct.

BRIEF DESCRIPTION OF THE DRAWINGS

The above and other features and advantages of the invention will become apparent from the following description, by way of example, of embodiments of the invention with reference to the accompanying drawings, in which.

DESCRIPTION OF THE PREFERRED EMBODIMENTS

Figure 1:
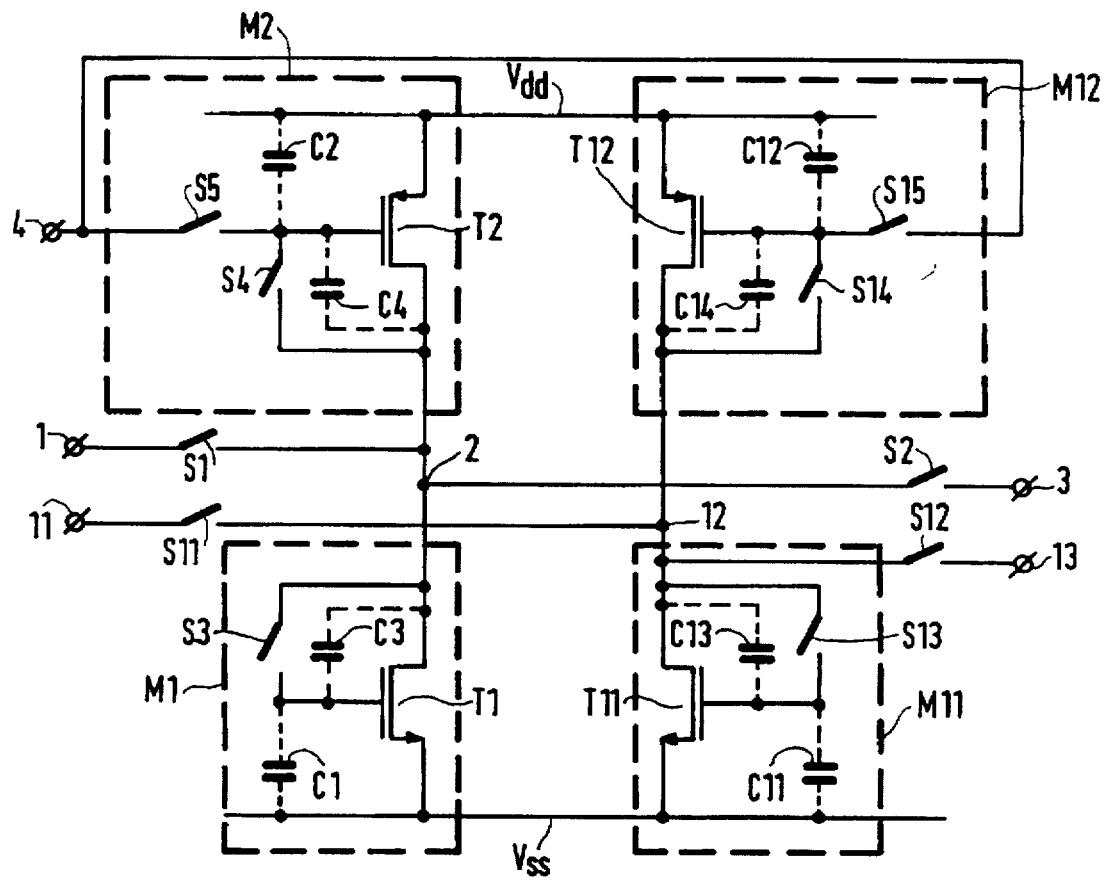
FIG. 1 is a circuit diagram of a known balanced current memory.

FIG. 1 is a circuit diagram of a balanced current memory using two S²I current memories as disclosed in EP-A-0608936. The balanced current memory comprises a first current memory including a coarse memory cell M1 and a fine memory cell M2 and a second current memory comprising a coarse current memory cell M11 and a fine current memory cell M12. The current memory has two inputs 1 and 11 for receiving balanced input currents. The input 1 is fed via a switch S1 to a summing node 2. The summing node 2 is connected via a switch S2 to an output 3. Similarly an input 11 is fed through a switch S11 to a summing node 12, the summing node 12 being connected to an output 13 via a switch S12. The coarse current memory cell M1 which forms part of the first current memory comprises an N-channel field effect transistor T1 whose source electrode is connected to a supply rail $V_{ss}$ and whose drain electrode is connected to the summing node 2. A switch S3 is connected between the gate and drain electrodes of transistor T1. The fine current memory cell M2 comprises a P-channel field effect transistor T2 whose source electrode is connected to a supply rail $V_{dd}$ and whose drain electrode is connected to the summing node 2. A switch S4 is connected between the gate and drain electrodes of transistor T2, while a switch S5 is connected between the gate electrode of transistor T2 and a terminal 4 to which a voltage reference source $V_{ref}$ is connected. Similarly, the second current memory comprises a coarse memory cell M11 and a fine memory cell M12. The coarse memory cell M11 consists of an N-channel field effect transistor T11 whose source electrode is connected to the supply rail $V_{ss}$ and whose drain electrode is connected to the summing node 12 while the gate electrode of T12 is connected via a switch S15 to the bias reference potential $V_{ref}$. The fine memory cell M12 comprises a P-channel field effect transistor T12 whose source electrode is connected to the supply rail $V_{dd}$ and whose drain electrode is connected to the summing node 12. A switch S14 is connected between the drain and gate electrodes of transistor T12 while a switch S15 is connected between the terminal 4 and the gate electrode of transistor T12.

The switches S1 and S11 are controlled by the waveform φ1, the switches S2 and S12 are controlled by the waveform φ2. Switches S3, S5, S13 and S15 are controlled by the waveform φ1a, and switches S4 and S14 are controlled by the waveform φ1b.

As has been described in the book referenced above and in EP-A-608936, when the switches connecting the drain and gate electrodes of transistors T1, T2, T11, and T12 open, the current through those transistors is maintained by the charge on the gate-source capacitances which are shown schematically as capacitors C1, C2, C11 and C12 in FIG. 1 and take the values Cp for the P-channel transistors and $C_N$ for the N-channel transistors. In addition drain-gate capacitances exist in transistors T1, T2, T11, and T12 and these are shown schematically as capacitors C3, C4, C13, and C14 respectively and take the values $C_{dgP}$ for the P-channel transistors and $C_{dgN}$ for the N-channel transistors.

Figure 2:
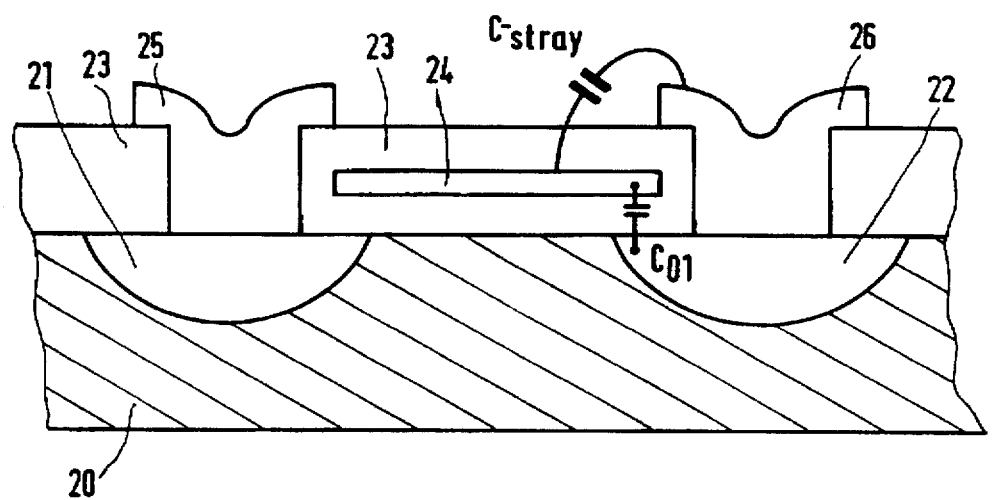
FIG. 2 shows the structure of a memory transistor used in the current memory illustrating the formation of stray capacitance.

In practice the transistors in the memory cells are usually made in a self-aligned CMOS IC process and parasitic drain-gate capacitances exist because the gate polysilicon overlaps the drain diffusion and because of stray capacitance between the gate polysilicon and the drain contact metallisation. This is illustrated in FIG. 2 which shows a substrate 20 in which source 21 and drain 22 diffusions have been made. The substrate has an oxide layer 23 in which a gate polysilicon layer 24 is embedded and which overlaps the source and drain diffusions. Source 25 and drain 26 metallisations are made to enable ohmic connection with those electrodes. Clearly there will be stray capacitance between the gate polysilicon 24 and the drain diffusion 22 and between the gate polysilicon 24 and the drain metallisation 26.

Any voltage variation at the output will consequently disturb the gate voltages of both the fine and coarse memory transistors and this will cause an error in the output current.

Figure 3:
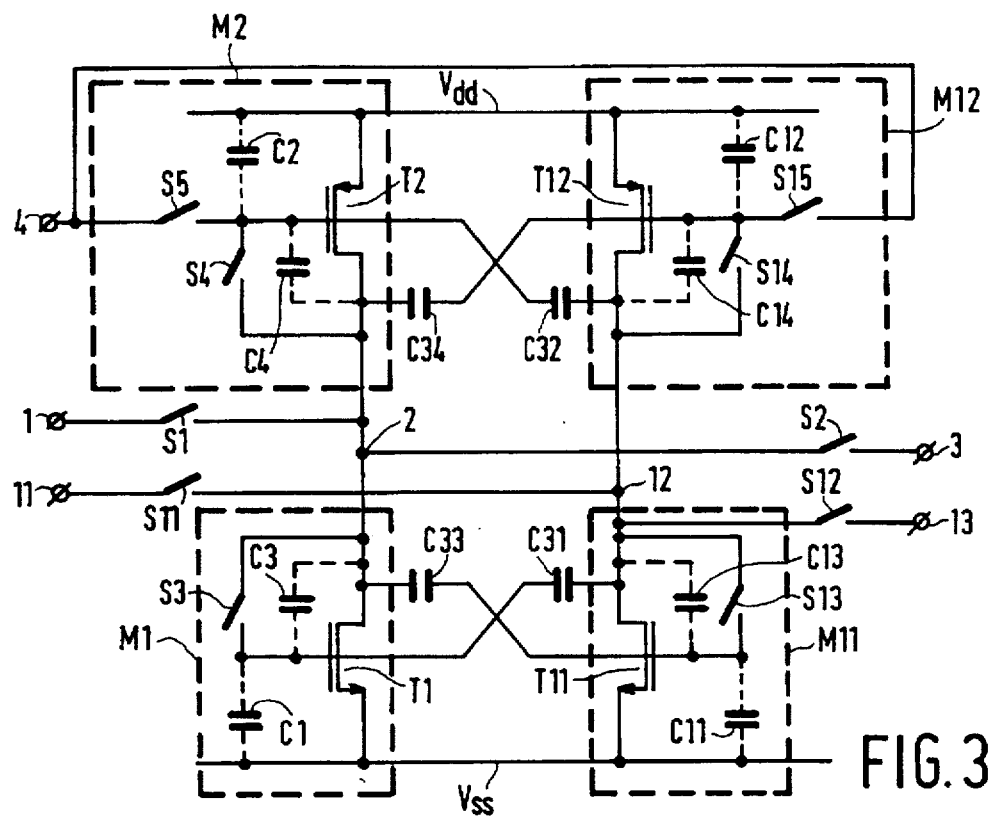
FIG. 3 is a circuit diagram of a first embodiment of a balanced current memory according to the invention.

FIG. 3 shows a current memory according to the invention which is based on that shown in FIG. 1. Consequently those elements having the same form and function as in FIG. 1 are given the same reference signs and only the differences will be considered in the description of the structures and operation of the embodiment of FIG. 3.

As shown in FIG. 3 four additional capacitors are provided, C31, C32, C33 and C34. Capacitor C31 is connected between the gate electrode of transistor T1 and the drain electrode of transistor T11, capacitor C32 is connected between the gate electrode of transistor T2 and the drain electrode of transistor T12, capacitor C33 is connected between the gate electrode of transistor T11 and the drain electrode of transistor T1, and capacitor C34 is connected between the gate electrode of transistor T12 and the drain electrode of transistor T2.

The value of capacitors C31 and C33 is equal to $C_{dgN}$ while the value of capacitors C32 and C34 is equal to $C_{dgP}$, where $C_{dgN}$ is the drain-gate capacitance of transistors T1 and T11 and $C_{dgP}$ is the drain-gate capacitance of transistors T2 and T12. For a balanced voltage disturbance at nodes 2 and 12 equal and opposite currents flow into each of the gate-source capacitances C1, C2, C11, C12 of the memory transistors. As a result, the disturbance to the gate voltages of the memory transistors and hence the error in the output current due to their gate-drain capacitances is minimised.

For best performance the neutralising capacitors should match very closely with the parasitic drain-gate capacitances. To illustrate how this may be achieved a construction of memory transistors utilizing an NMOS memory transistor, having an even number of parallel sub-transistors (in this case two) is shown in FIG. 4.

Figure 4:
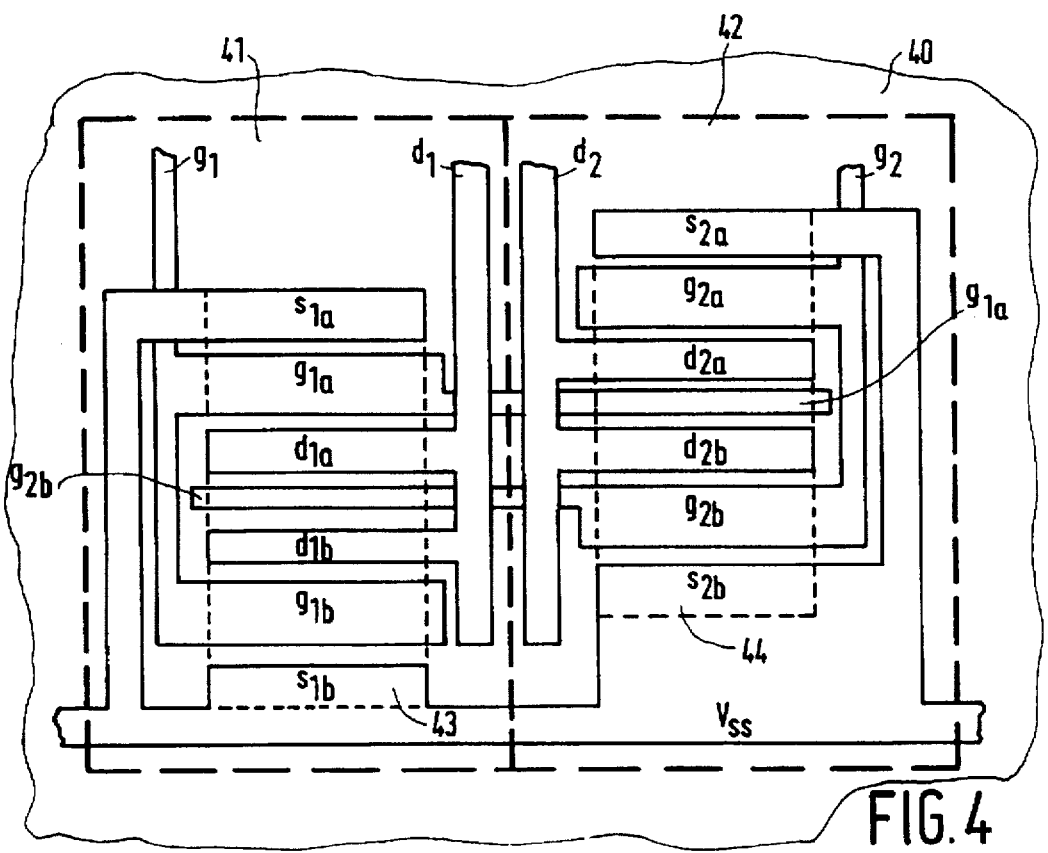
FIG. 4 shows one structure for two memory transistors and associated neutralising capacitors

As shown in FIG. 4 an area of substrate 40 having an oxide layer deposited on it carries two transistors 41 and 42, each of which comprise two sub-transistors. Windows 43 and 44 are formed in the oxide layer and gate polysilicon layers are deposited. The gate connection g1 connects to two polysilicon gate areas g1a and g1b which extend over part of the window 43. The gate area g1a is also extended to cover a portion of the window 44. The gate connection g2 connects to two polysilicon gate areas g2a and g2b which extend to cover a portion of the window 44, the gate area g2b also extending to cover a portion of the window 43. A drain metallisation d1 connects to two metal contact d1a and d1b areas above drain diffusions in the window 43 which are positioned on either side of the gate extension g2b. Similarly a drain metallisation d2 connects to metal contact d2a and d2b areas above drain diffusions in the window 44 which are positioned on either side of the gate extension g1a. Source metallisations s1a, s1b, s2a, s2b extend over source diffusions in the windows 43 and 44 and are connected to voltage supply metallisation $V_{ss}$.

The required capacitors C31 and C33 are formed by the transistors sandwiched between the two connected drains, i.e. d1a, g2b, d1b and d2a, g1a, d2b. Each transistor shares its source and drain with the double drain of its memory transistor and the gate is connected to the gate of its complementary memory transistor as it is an extension thereof.

In operation, provided that the voltage swings of the S²I memory are not excessive, and this is normally the case for saturated operation of the memory transistors, the neutralising transistors remain in the cut-off region and contribute the same overlap and stray capacitances at either edge of their gates and consequently match in total the combined parasitic drain-gate capacitances of the double sub-transistors forming the memory transistors.

Figure 5:
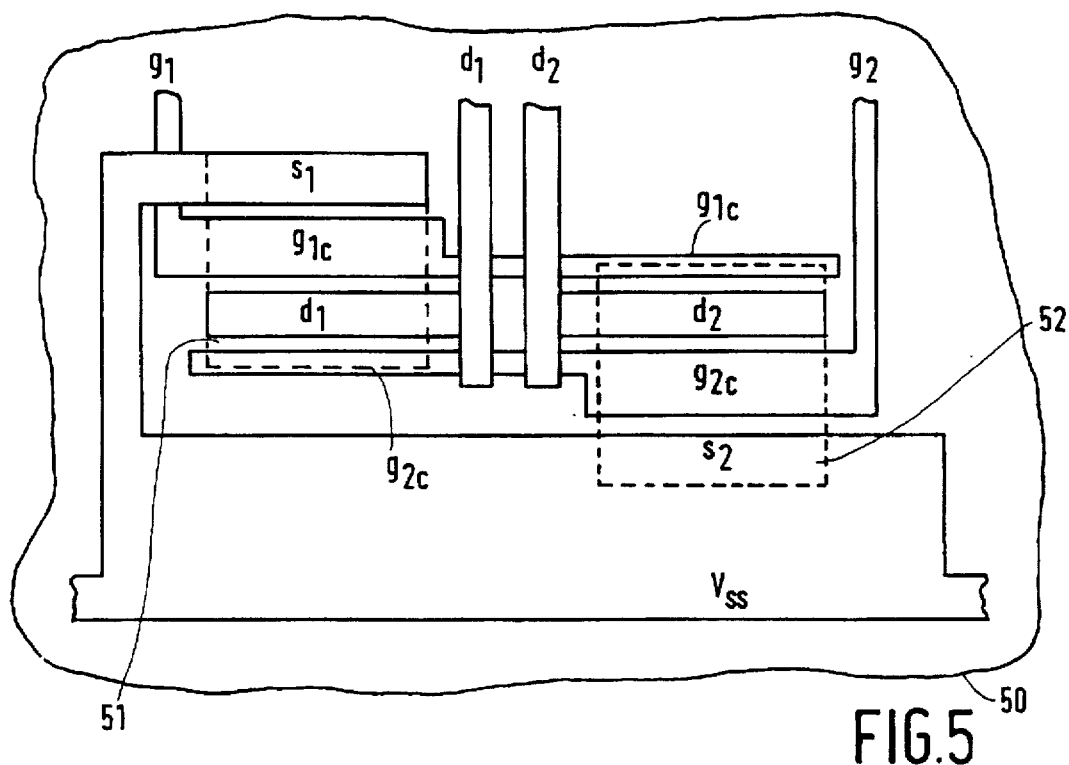
FIG. 5 shows an alternative structure for two memory transistors and associated neutralising capacitors.

When the memory transistors comprise an odd number of sub-transistors or a single transistor, the neutralisation may be achieved by the structure shown in FIG. 5 (combined with one or more of the structures as shown in FIG. 4 as appropriate for a plurality of sub-transistors). In the structure shown in FIG. 5 the active areas 51 and 52 (shown dotted) extend beyond the drain areas d1 and d2. The remote boundaries of these extended active areas are covered with polysilicon regions g1c and g2c which act as masks defining the remote boundary of the drain diffusions. The result is a pair of transistors having drain electrodes d1 and d2 which overlap the extra polysilicon areas g1c and g2c by the same amount that they overlap their own gate polysilicon regions g1 and g2. This produces external capacitors which match those of the parasitic drain-gate capacitances of their memory transistors. Neutralisation is again achieved by connecting the additional polysilicon regions g1c and g2c to their complementary transistors gates g2 and g1 respectively. The same constraints (as with the structure of FIG. 4) on voltage swings is needed to avoid formation of an inversion layer beneath the extra polysilicon.

Combinations of the structures shown in FIG. 4 and FIG. 5 can produce neutralising capacitors for any number (odd or even) of sub-transistors. The structures shown have the advantages that they contribute no extra capacitance between the drains of the memory transistors and the substrate and do not introduce extra leakage at the gates of the memory transistors. In addition mask misalignment producing shifts between the polysilicon and drain metal areas give equal changes to the parasitic drain-gate capacitances and their neutralising capacitors.

The foregoing description has revealed how to compensate for the effect of the drain-gate capacitance of the memory transistors on the output current produced. The neutralisation of current transport errors due to drain conductance and charge injection will now be disclosed.

Figure 6:
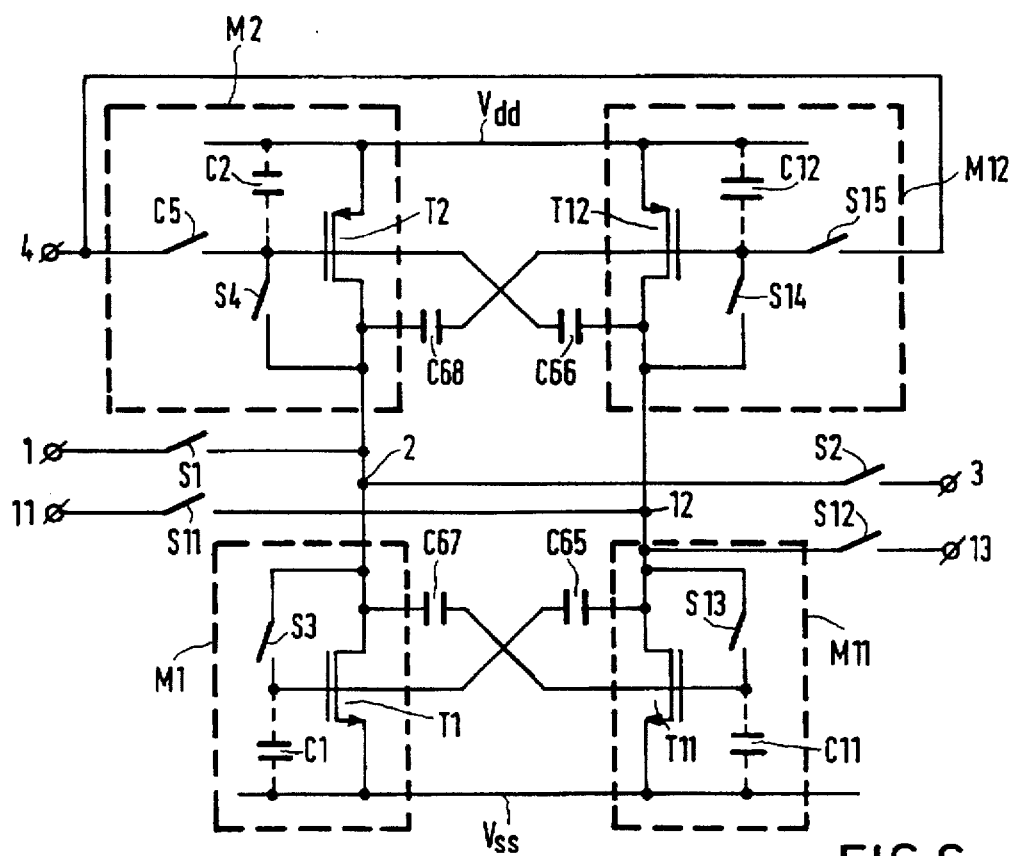
FIG. 6 is a circuit diagram of a second embodiment of a balanced current memory according to the invention.

FIG. 6 shows an S²I memory cell of the form shown in FIG. 3 with parasitic drain conductances and extra neutralising capacitors (the parasitic drain-gate capacitances are left out as it is assumed that they have been separately neutralised as indicated above). It can be shown that the current transport errors of the coarse and fine memories are given by, $$\epsilon_N = \frac{(2g_{dsN} + g_{dsP}) - 2m_N g_{mN} - 2m_P g_{mP}}{g_{mN}} \quad (1)$$

and $$\epsilon_P = \frac{(2g_{dsN} + g_{dsP}) - 2m_N g_{mN} - 2m_P g_{mP}}{g_{mN}} \quad (2)$$

where $g_{dsN}$ and $g_{dsP}$, and $g_{mN}$ and $g_{mP}$ are the drain conductances and transconductances of the coarse and fine memory transistors respectively and, $$m_N = \frac{C_N}{C_N + C_N'} \quad (3)$$

$$m_P = \frac{C_P}{C_P + C_P'} \quad (4)$$

Where $C_N$ is the capacitance of the gate-source capacitors C1 and C11

$C_P$ is the capacitance of the gate-source capacitors C2 and C12

$C_N'$ is the capacitance of the neutralising-capacitors C65 and C67

$C_P'$ is the capacitance of the neutralising-capacitors C66 and C68.

By inspection, $\epsilon_N = \epsilon_P = 0$ when $m_P = 0$ and $m_N = (g_{dsN} + g_{dsP})$ $g_{mN}$.

In this condition, no current transport error occurs in either the coarse or fine memories, and so also in the S²I memory cell. Cancellation of errors has occurred by employing technologically dissimilar parameters (in this case, drain conductance and additional, as yet unspecified, capacitance) which will not track with IC process spreads. However, cancellation may be achieved at one specified process condition. In a filter application, for example, it may be used to centre a design frequency that is in error due to drain conductance effects, under nominal conditions.

In general, the current transport error of a memory cell in which the drain-gate capacitance has already been neutralised results from the combination of errors resulting from drain conductance, charge injection etc. A practical approach to this situation is to measure the total error for a particular design by means of transient simulation using a transistor level simulator (e.g. spice) and to apply neutralisation capacitors according to, $$C' = C \frac{\epsilon}{2 - \epsilon} \quad (5)$$

where, C' and C are the neutralisation and gate-source capacitances respectively and $\epsilon$ is the un-neutralised error. For the S²I memory cell, this neutralisation may be applied only to the coarse memory to cancel its errors. While this may not give simultaneous neutralisation of the fine memory errors, this is unnecessary if the coarse memory has no net errors.

The additional neutralisation capacitors C65 and C67 may be made by simply extending the drain metal to cover sufficient of the neutralising polysilicon (already present to neutralise the drain-gate capacitance) to produce the required additional stray capacitance.

Figure 7:
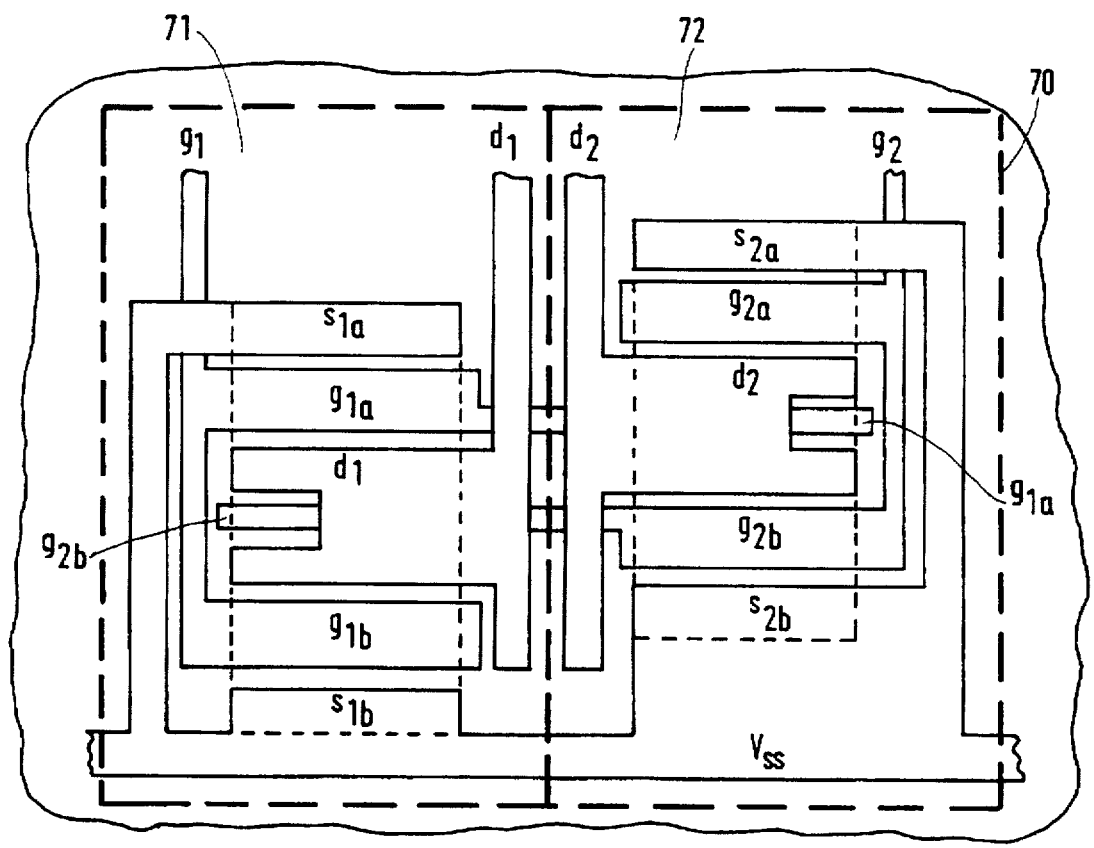
FIG. 7 shows how the structure of FIG. 4 can be modified to implement the circuit of FIG. 6.
Figure 8:
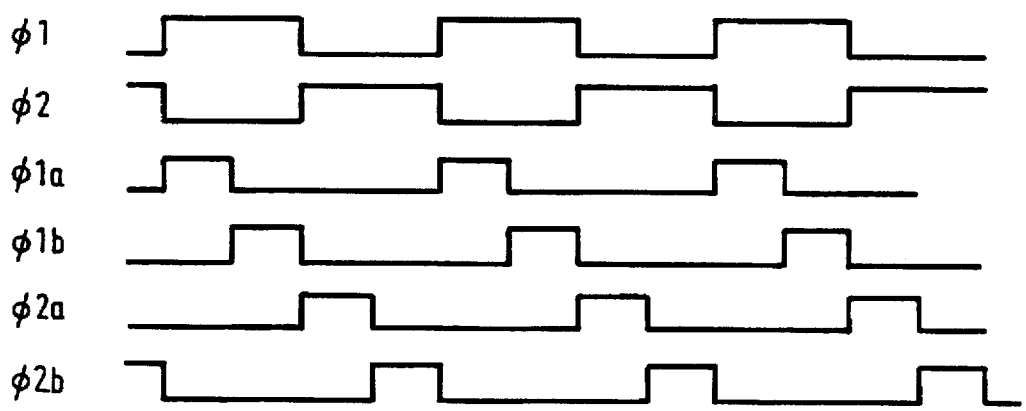
FIG. 8 shows clock waveforms for controlling the switches in the current memories of FIGS. 1, 3 and 6.

FIG. 7 shows how the structure of FIG. 4 can be modified to produce the extra capacitance required to neutralise the gate conductance and other effects in addition to neutralising the gate-drain capacitance of the memory transistors. In FIG.

7 the two transistors 70 and 71 are formed from two sub-transistors as in FIG. 4. In this case, however, the two drain areas d1a and d1b and d2a and d2b are linked to form areas d1 and d2 and extend over the gate polysilicon extensions, g2b and g1a respectively, to form the additional capacitance.

The same neutralisation technique may be applied to neutralise the Miller capacitances of a balanced voltage amplifier, for example, a long tail pair voltage amplifier which may form, or may form the input stage of, an operational amplifier. Such neutralisation will increase the available band width and improve stability.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention.

We claim:

1. An analogue current memory for storing input signals in the form of sampled currents comprising: first and second inputs for receiving balanced current samples, first and second outputs for supplying stored balanced current samples, a first current memory cell having an input coupled to the first input of the current memory and an output coupled to the first output of the current memory, and a second current memory cell having an input coupled to the second input of the current memory and an output coupled to the second output of the current memory; wherein the first and second current memory cells each comprise a coarse memory cell and a fine memory cell, the coarse memory cell sampling the input current during a first part of a first portion of a clock cycle and the fine current memory cell sampling the input current and the current stored by the coarse memory cell during a second part of the first portion of the clock cycle, said first and second current memory cells producing a stored output current during a second portion of said clock cycle or during a subsequent clock cycle, said stored output current being the combined outputs of the coarse and fine memory cells, in which the coarse and fine memory cells each comprise a field effect transistor having a switch connected between its gate and drain electrodes, a stored output current being available when said switch is open, characterised in that the gate electrode of the field effect transistor in each coarse memory cell is connected to the drain electrode of the transistor in the other coarse memory cell via a capacitor having a capacitance equal to the drain gate capacitance of the transistors in the coarse memories and in that the gate electrode of the transistor in each fine current memory cell is connected to the drain electrode of the transistor in the other fine current memory cell via a capacitor having a capacitance equal to the drain-gate capacitance of the transistors in the fine memories.

2. A current memory as claimed in claim 1 in which the capacitance of the capacitors is increased to compensate for other imperfections in the transistors.

3. A current memory as claimed in claim 1 in which the transistors of two coarse, or two fine, current memory cells are arranged opposite each other on a substrate and are each formed as two subtransistors, wherein the gate polysilicon of one transistor is extended to be interleaved with the two drain electrodes of the other transistor.

4. A current memory as claimed in claim 3 in which the two drain electrodes have a common area which extends over at least part of the extension of the gate polysilicon.

5. A current memory as claimed in claim 1 in which the transistors of two coarse, or two fine, current memory cells are arranged opposite each other on a substrate, the direction of the drain, gate, and source of one being opposite to that of the other, wherein the active area is extended past the drain electrode and its outer edge is defined by an extension of the gate polysilicon of the other transistor.

6. A current memory as claimed in claim 2 in which the transistors of two coarse, or two fine, current memory cells are arranged opposite each other on a substrate and are each formed as two subtransistors, wherein the gate polysilicon of one transistor is extended to be interleaved with the two drain electrodes of the other transistor.

7. A current memory as claimed in claim 6 in which the two drain electrodes have a common area which extends over at least part of the extension of the gate polysilicon.

8. A current memory as claimed in claim 2 in which the transistors of two coarse, or two fine, current memory cells are arranged opposite each other on a substrate, the direction of the drain, gate, and source of one being opposite to that of the other, wherein the active area is extended past the drain electrode and its outer edge is defined by an extension of the gate polysilicon of the other transistor.

9. A current memory as claimed in claim 3 in which the transistors of two coarse, or two fine, current memory cells are arranged opposite each other on a substrate, the direction of the drain, gate, and source of one being opposite to that of the other, wherein the active area is extended past the drain electrode and its outer edge is defined by an extension of the gate polysilicon of the other transistor.

10. A current memory as claimed in claim 1 further comprising:

a first circuit node between the field effect transistor of the coarse memory cell and the field effect transistor of the fine memory cell of the first current memory cell, a second circuit node between the field effect transistor of the coarse memory cell and the field effect transistor of the fine memory cell of the second current memory cell, a first switch connected between the first input and the first circuit node, a second switch connected between the first output and the first circuit node, a third switch connected between the second input and the second circuit node, a fourth switch connected between the second output and the second circuit node, and wherein the first and third switches are closed together during one part of the clock cycle and the second and fourth switches are closed together during a further part of the clock cycle that does not overlap said one part of the clock cycle.

* * * * *